US007592867B2

(12) United States Patent
Trifonov et al.

(10) Patent No.: US 7,592,867 B2

(45) Date of Patent: Sep. 22, 2009

(54) COMMON MODE FEEDBACK FOR LARGE OUTPUT SWING AND LOW DIFFERENTIAL ERROR

(75) Inventors: Dimitar T. Trifonov, Vail, AZ (US); Marco A. Gardner, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 11/732,357

(22) Filed: Apr. 3, 2007

(65) Prior Publication Data

US 2008/0246543 A1 Oct. 9, 2008

(51) Int. Cl.
*H03F 3/45* (2006.01)

(52) U.S. Cl. ........................................ 330/253; 330/258

(58) Field of Classification Search ................. 330/258, 330/259, 9; 341/161, 155
See application file for complete search history.

(56) References Cited

U.S. PATENT DOCUMENTS 6,624,698 B2 * 9/2003 Nagaraj ...................... 330/258
7,382,307 B2 * 6/2008 Dura et al. .................. 341/161

* cited by examiner

*Primary Examiner*—Robert Pascal
*Assistant Examiner*—Hieu P Nguyen
(74) *Attorney, Agent, or Firm*—John J. Patti; Wade J. Brady, III; Frederick J. Telecky, Jr.

(57) ABSTRACT

A differential amplifier includes a differential input pair (2A) coupled to a folded cascode stage (2B) and a common mode feedback circuit (34) including a tracking circuit (30A) coupled to first ($Vout^-$) and second ($Vout^+$) outputs of the folded cascode stage (2B). The first and second outputs are coupled to first terminals of first (31A) and second (31B) tracking capacitors which have second terminals on which a first common mode output signal ($V_{CM1}$) is produced and also are coupled to first terminals of third (32A) and fourth (32B) tracking capacitors, respectively, which have second terminals on which a second common mode output signal ($V_{CM2}$) is produced. The first and third tracking capacitors are discharged by first (27A) and second (27B) switches that directly couple the first and second outputs to first and second inputs of a common mode feedback amplifier (4). A desired common mode output voltage ($V_{CM-IN}$) is applied to a third input of the common mode feedback amplifier. The switches are opened to cause the first and second common mode output voltages to be generated, causing a common mode feedback control signal ($V_{CMFB}$) to be generated for biasing the folded cascode stage.

20 Claims, 3 Drawing Sheets

COMMON MODE FEEDBACK FOR LARGE OUTPUT SWING AND LOW DIFFERENTIAL ERROR

BACKGROUND OF THE INVENTION

The present invention relates generally to common mode feedback circuits for fully differential amplifiers, and more particularly to common mode feedback circuits which avoid introducing errors into the differential output signal.

All fully differential amplifiers (i.e., differential amplifiers having both differential inputs and a differential outputs) have a common mode feedback circuit. For example, differential amplifier 1A of FIG. 1, which includes a typical differential input transistor pair 2A and a typical folded cascode stage 2B, also includes a common mode feedback circuit 3. The inputs of common mode feedback circuit 3 are coupled to the outputs $Vout^+$ and $Vout^-$ of folded-cascode stage 2B, and the output of common mode feedback circuit 3 is fed back via common mode feedback conductor 22 to P-channel current source transistors 15 and 16 of folded cascode stage 2B.

The main requirements of a common mode feedback circuit are to (1) keep the outputs $Vout^+$ and $Vout^-$ of the amplifier within a suitable range, (2) to have as little effect as possible on the differential output voltage ($Vout^+-Vout^-$), and (3) to keep the output common mode voltage ($V_{CMO}$) constant. It is important that the output common mode voltage $V_{CMO}$ be kept constant since it affects the differential voltage $Vout^+-Vout^-$ because of the output characteristics of the differential amplifier itself. (A non-constant $V_{CMO}$ affects the differential output voltage in two ways. First, it affects the linearity of the amplifier, and second, it "moves" and thereby limits the output voltage swing.) Also, $V_{CMO}$ should be constant because if it is not constant and if the CMRR (common mode rejection ratio) of circuitry following the differential amplifier is low, this results in signal errors. Furthermore, the common mode feedback frequently has to operate with large output voltage swings of the differential amplifier. Also, the common mode feedback may need to operate with differential amplifiers having an auto-zero phase and an active amplification phase.

The common mode feedback circuit 3 shown in Prior Art FIG. 1 keeps the outputs in an operational range, but provides very poor control of the output common mode voltage $V_{CMO}$. Furthermore, common mode feedback circuit 3 of Prior Art FIG. 1 operates effectively only for relatively small swings of the differential output voltage $Vout^+-Vout^-$. If the differential output voltage $Vout^+-Vout^-$ increases, common mode feedback circuit 3 keeps one of the output voltages $Vout^+$ or $Vout^-$ approximately constant, and therefore the output common mode voltage $V_{CMO}$ (which is the average of $Vout^+$ and $Vout^-$) varies over a wide range. The output voltage swings are small because if the differential output voltage is large, then one of transistors 23 and 24 is off and therefore has no effect on the common mode feedback control voltage on conductor 22, and therefore only one of the output voltages $Vout^+$ or $Vout^-$ controls the common mode feedback control voltage. The common mode feedback control voltage on conductor 22 just follows the lower of $Vout^+$ and $Vout^-$, and therefore does not track to the actual output common mode voltage, i.e., does not track the average of $Vout^+$ and $Vout^-$. Also, variation of the output common mode voltage $V_{CMO}$ of common mode feedback circuit 3 varies significantly with semiconductor processing variables and with circuit temperature.

Another prior art common mode feedback circuit 3A is shown in the differential amplifier 1B of FIG. 2. In this common mode feedback circuit, a tracking circuit 30 includes equal tracking capacitors 31 and 32 and a CMOS transmission gate switch 27 that is controlled by a "phase one" signal PH1 which occurs before normal amplifying, referred to as "phase 2". PH1 can be an auto-zero signal in a typical case in which an auto-zeroing circuit is connected to output conductors 19 and 20 of folded cascode circuit 2B. The auto-zeroing circuit cross-connects $Vin^+$ to $Vout^-$ and $Vin^-$ to $Vout^+$ during the auto-zeroing phase, during which time the differential input voltage is very small. Then the resulting differential output voltage is equal to the magnitude of the differential amplifier input offset voltage. Next, switch 27 is closed, which discharges tracking capacitor 32, so the offset voltage appears across tracking capacitor 31. This provides $V_{CM1}$ as a DC bias point on the gate of a P-channel input transistor 35 of transistor pair 21A which also includes P-channel input transistors 36. Switch 27 when closed also prevents $V_{CM1}$ from electrically "floating", i.e., from changing as a result of leakage currents associated with conductor 33. During the amplification phase of operation of differential amplifier 1B, switch 27 is open, and $V_{CM1}$ therefore is equal to the common mode output voltage of differential amplifier 1B (i.e. to the average value of $Vout^+$ and $Vout^-$).

The gate of input transistor 36 receives the voltage $V_{CM-IN}$, which is the constant desired common mode output voltage of differential amplifier 1B. $V_{CM-IN}$ may be provided by a reference voltage circuit, for example a voltage divider. The drains of input transistors 35 and 36 are connected to the summing nodes 39 and 40, respectively, of a folded cascode circuit 21B of common mode feedback circuit 3A. Common mode feedback circuit 3A can zero itself during auto-zeroing (i.e., during PH1) and can also track the output differential voltage $Vout^+-Vout^-$ during the amplifying phase by means of equal tracking capacitors 31 and 32.

Common mode feedback circuit 3A of Prior Art FIG. 2 allows both large $Vout^+$ and $Vout^-$ voltage swings of differential amplifier stage 2 and precise control of the output common mode voltage. The main problem of common mode feedback circuit 3A of Prior Art FIG. 2 is that charge is injected on only one of the output voltages (i.e., only on $Vout^+$) by parasitic capacitance of CMOS transmission gate switch 27 when it opens at the end of PH1. The injected charge generates a spike voltage on $Vout^+$. This introduces an error in the output differential voltage $Vout^+-Vout^-$. (It should be appreciated that providing an additional switch similar to switch 27 across tracking capacitor 31 to balance the above mentioned charge injection would short-circuit $Vout^+$ and $Vout^-$ together, which would be unacceptable because it does not allow input offset correction during this phase.

Thus, there is an unmet need for a common mode feedback circuit which operates effectively with any two-phase fully differential amplifier.

There also is an unmet need for a common mode feedback circuit which operates effectively with any two-phase fully differential amplifier and has very little effect on the differential output voltage of the differential amplifier.

There also is an unmet need for a common mode feedback circuit which operates effectively with any two-phase fully differential amplifier and keeps the common mode output voltage constant.

There also is an unmet need for a common mode feedback circuit which operates effectively with any two-phase fully differential amplifier and keeps the common mode output voltage constant and also keeps the amplifier output voltages within a suitable range.

There also is an unmet need for a common mode feedback circuit which operates effectively with any two-phase fully differential amplifier and does not short circuit the differential amplifier outputs during auto-zeroing of the differential amplifier.

There also is an unmet need for a common mode feedback circuit which operates effectively with any two-phase fully differential amplifier and accurately tracks the common mode voltage during both an auto-zeroing phase and an amplification phase.

There also is an unmet need for a common mode feedback circuit which operates effectively with any two-phase fully differential amplifier and precisely controls the output common mode voltage.

SUMMARY OF THE INVENTION

Thus, there is an unmet need for a common mode feedback circuit which operates effectively with any two-phase fully differential amplifier.

It is another object of the invention to provide a common mode feedback circuit which operates effectively with any two-phase fully differential amplifier and has very little effect on the differential output voltage of the differential amplifier.

It is another object of the invention to provide a common mode feedback circuit which operates effectively with any two-phase fully differential amplifier and keeps the common mode output voltage constant.

It is another object of the invention to provide a common mode feedback circuit which operates effectively with any two-phase fully differential amplifier and keeps the common mode output voltage constant and also keeps the amplifier output voltages within a suitable range.

It is another object of the invention to provide a common mode feedback circuit which operates effectively with any two-phase fully differential amplifier and does not short circuit the differential amplifier outputs during auto-zeroing of the differential amplifier.

It is another object of the invention to provide a common mode feedback circuit which operates effectively with any two-phase fully differential amplifier and accurately tracks the common mode voltage during both an auto-zeroing phase and an amplification phase.

It is another object of the invention to provide a common mode feedback circuit which operates effectively with any two-phase fully differential amplifier and precisely controls the output common mode voltage.

Briefly described, and in accordance with one embodiment, the present invention provides a differential amplifier which includes a differential input pair (2A) coupled to a folded cascode stage (2B) and a common mode feedback circuit (34) including a tracking circuit (30A) coupled to first ($Vout^-$) and second ($Vout^+$) outputs of the folded cascode stage (2B). The first and second outputs are coupled to first terminals of first (31A) and second (31B) tracking capacitors which have second terminals on which a first common mode output signal ($V_{CM1}$) is produced and also are coupled to first terminals of third (32A) and fourth (32B) tracking capacitors, respectively. The third (32A) and fourth (32B) tracking capacitors have second terminals on which a second common mode output signal ($V_{CM2}$) is produced. The first and third tracking capacitors are discharged by first (27A) and second (27B) switches that directly couple the first and second outputs to first and second inputs of a common mode feedback amplifier (4). A desired common mode output voltage ($V_{CM-IN}$) is applied to a third input of the common mode feedback amplifier. The switches are opened to cause the first and second common mode output voltages to be generated, causing a common mode feedback control signal ($V_{CMFB}$) to be generated for biasing the folded cascode stage.

In one embodiment, the invention provides a differential amplifier (10) including a differential input transistor pair (2A) having first (5) and second (6) input transistors, a first folded cascode stage (2B) including first (9) and second (8) summing junctions coupled to drains of the first (5) and second (6) input transistors, respectively, and first (20) and second (19) outputs conducting first ($Vout^-$) and second ($Vout^+$) output signals, respectively. First (12) and second (11) current source transistors have drains coupled by the first (9) and second (8) summing junctions, respectively, to sources of first (14) and second (13) cascode transistors. The first (14) and second (13) cascode transistors have drains coupled to the first (20 and second (19) outputs, respectively, and third (16) and fourth (15) current source transistors have drains coupled to the first (20) and second (19) outputs, respectively. A common mode feedback circuit (34) includes a tracking circuit (30A) coupled to the first (20) and second (19) outputs for producing first ($V_{CM1}$) and second ($V_{CM2}$) common mode output signals in response to the first ($Vout^-$) and second ($Vout^+$) output signals. An auxiliary amplifier stage (4) includes a differential input stage (26A) including third (35A), fourth (35B) and fifth (36) input transistors. Gates of the third (35A) and fourth (35B) input transistors are coupled to receive the first ($V_{CM1}$) and second ($V_{CM2}$) common mode output signals, respectively. A gate of the fifth (36) input transistor is coupled to receive a desired common mode voltage ($V_{CM-IN}$). Drains of the third (35A) and fourth (35B) input transistors are coupled to a third summing junction (39) in a second folded cascode circuit (26B) having an output (22). A drain of the fifth input transistor (36) is coupled to a fourth summing junction (40) in the second folded cascode circuit (26B). The output (22) of the second folded cascode circuit (26B) couples a common mode feedback control signal ($V_{CMFB}$) to bias gates of the third (16) and fourth (15) current source transistors.

In the described embodiment, the tracking circuit (30A) includes a first section (30A-1) coupled to receive both the first ($Vout^-$) and second ($Vout^+$) output signals for producing the first common mode output signal ($V_{CM1}$) and a second section (30A-2) coupled to receive both the first ($Vout^-$) and second ($Vout^+$) output signals for producing the second common mode output signal ($V_{CM2}$). The first section (30A-1) includes first (31A) and second (31B) tracking capacitors having first terminals connected to produce the first common mode output signal ($V_{CM1}$) and a first switch (27A) coupled across the first tracking capacitor (31A). A second terminal of the first tracking capacitor (31A) is coupled to receive the first output signal ($Vout^-$), and a second terminal of the second tracking capacitor (31B) is coupled to receive the second output signal ($Vout^+$). The second section (30A-2) includes third (32A) and fourth (32B) tracking capacitors having first terminals connected to produce the second common mode output signal ($V_{CM2}$) and a second switch (27B) coupled across the third tracking capacitor (32A). A second terminal of the third tracking capacitor (32A) is coupled to receive the second output signal ($Vout^+$), and a second terminal of the fourth tracking capacitor (32B) is coupled to receive the first output signal ($Vout^-$). In the described embodiment, the capacitances of the first (31A), second (31B), third (32A) and fourth (32B) tracking capacitors) are equal and the sizes of the first (27A) and second (27B) switches are equal, which results in symmetric charge injection into the first (20) and second (19) outputs of the first folded-cascode stage (2B) so as to eliminate errors due to asymmetric charge injection.

In a described embodiment, the first (5) and second (6) input transistors are P-channel transistors and the first (12) and second (11) current source transistors and the first (14) and second (13) cascode transistors are N-channel transistors. The third (16) and fourth (15) current source transistors are P-channel transistors. The first folded-cascode stage (2B) includes a P-channel third cascode transistor (18) coupled between a drain of the third current source transistor (16) and the first output (20) and a P-channel fourth cascode transistor (17) coupled between the drain of the fourth current source transistor (15) and the second output (19). The third (35A), fourth (35B), and fifth (36) input transistors are P-channel transistors. The second folded cascode circuit (26B) includes a N-channel fifth cascode transistor (43) having a source coupled to the third summing junction (39) and a drain coupled to a drain and gate of a P-channel seventh current source transistor (49) and a N-channel sixth cascode transistor (44) having a source coupled to the fourth summing junction (40) and a drain coupled to a drain and gate of a P-channel eighth current source transistor (50) and to the output (22) conducting the common mode feedback control signal ($V_{CMFB}$). In operation, the first (27A) and second (27B) switches are closed in response a phase signal (PH1) during an initial phase and then are opened during an amplifying phase of the differential amplifier (10).

In a described embodiment, an auto-zeroing circuit (56) is coupled to the first (20) and second (19) outputs of the first folded cascode stage (2B).

In one embodiment, the invention provides a method of reducing error in a differential amplifier (10) including a differential input transistor pair (2A) coupled to a folded cascode stage (2B), and a common mode feedback circuit (34) including a tracking circuit (30A) coupled to first ($Vout^-$) and second ($Vout^+$) outputs of the folded cascode stage (2B). The method includes coupling the first ($Vout^-$) and second ($Vout^+$) outputs to first terminals of first (31A) and second (31B) tracking capacitors, respectively, in a first section (30A-1) of the tracking circuit (30A), the first (31A) and second (31B) tracking capacitors having second terminals on which a first common mode output signal ($V_{CM1}$) is produced, coupling the second ($Vout^+$) and first ($Vout^-$) outputs of the folded-cascode stage (2B) to first terminals of third (32A) and fourth (32B) tracking capacitors, respectively, in a second section (30A-2) of the tracking circuit (30A), the third (32A) and fourth (32B) tracking capacitors having second terminals on which a second common mode output signal ($V_{CM2}$) is produced, discharging the first tracking capacitor (31A) and producing a direct coupling of the first output ($Vout^-$) to a first input of an auxiliary common mode feedback amplifier (4), discharging the third tracking capacitor (32A) and producing a direct coupling of the second output ($Vout^+$) to a second input of the auxiliary common mode feedback amplifier (4), applying a desired common mode output voltage ($V_{CM\text{-}IN}$) to a third input of the auxiliary common mode feedback amplifier (4), terminating the direct couplings to cause the first ($V_{CM1}$) and second ($V_{CM2}$) common mode output voltages to be produced, generating a common mode feedback control signal ($V_{CMFB}$) by means of the auxiliary common mode feedback amplifier (4), and applying the common mode feedback control signal ($V_{CMFB}$) to bias the folded cascode stage (2B). In a described embodiment, the method includes closing a first switch (27A) coupled across the first tracking capacitor (31A) to discharge the first tracking capacitor (31A) and produce the direct coupling of the first output ($Vout^-$) and closing a second switch (27B) coupled across the third tracking capacitor (32A) to discharge the third tracking capacitor (32A) and produce the direct coupling of the second output ($Vout^+$), and opening the first (27A) and second (27B) switches to terminate the direct couplings.

In one embodiment, the invention provides differential amplifier (10) including a differential input transistor pair (2A) coupled to a folded cascode stage (2B) and a common mode feedback circuit (34) including a tracking circuit (30A) coupled to first ($Vout^-$) and second ($Vout^+$) outputs of the folded cascode stage (2B), means (20,19) for coupling the first ($Vout^-$) and second ($Vout^+$) outputs to first terminals of first (31A) and second (31B) tracking capacitors, respectively, in a first section (30A-1) of the tracking circuit (30A), the first (31A) and second (31B) tracking capacitors having second terminals on which a first common mode output signal ($V_{CM1}$) is produced, and means (20,19) for coupling the second ($Vout^+$) and first ($Vout^-$) outputs of the folded-cascode stage (2B) to first terminals of third (32A) and fourth (32B) tracking capacitors, respectively, in a second section (30A-2) of the tracking circuit (30A), the third (32A) and fourth (32B) tracking capacitors having second terminals on which a second common mode output signal ($V_{CM2}$) is produced, means (27A) for discharging the first tracking capacitor (31A) and producing a direct coupling of the first output ($Vout^-$) to a first input of an auxiliary common mode feedback amplifier (4), and means (27B) for discharging the third tracking capacitor (32A) and producing a direct coupling of the second output ($Vout^+$) to a second input of the auxiliary common mode feedback amplifier (4), and applying a desired common mode output voltage ($V_{CM\text{-}IN}$) to a third input of the auxiliary common mode feedback amplifier (4), means (27A,B) for terminating the direct couplings to cause the first ($V_{CM1}$) and second ($V_{CM2}$) common mode output voltages to be produced, and means (4,22) for generating a common mode feedback control signal ($V_{CMFB}$) by means of the auxiliary common mode feedback amplifier (4) and applying the common mode feedback control signal ($V_{CMFB}$) to bias the folded cascode stage (2B).

DETAILED DESCRIPTION OF THE PREFERRED EMBODIMENTS

The present invention provides a common mode feedback circuit with fully differential behavior for fully differential amplifiers. This common mode feedback circuit avoids short-circuiting of the amplifier outputs during auto-zeroing of the amplifier, tracks the desired common mode voltage $V_{CM\text{-}IN}$ during both phases, and precisely controls the output common mode voltage. A simplified schematic diagram of a fully differential amplifier 10 including a common mode feedback circuit 34 in accordance with the present invention is shown in FIG. 3.

Figure 3:
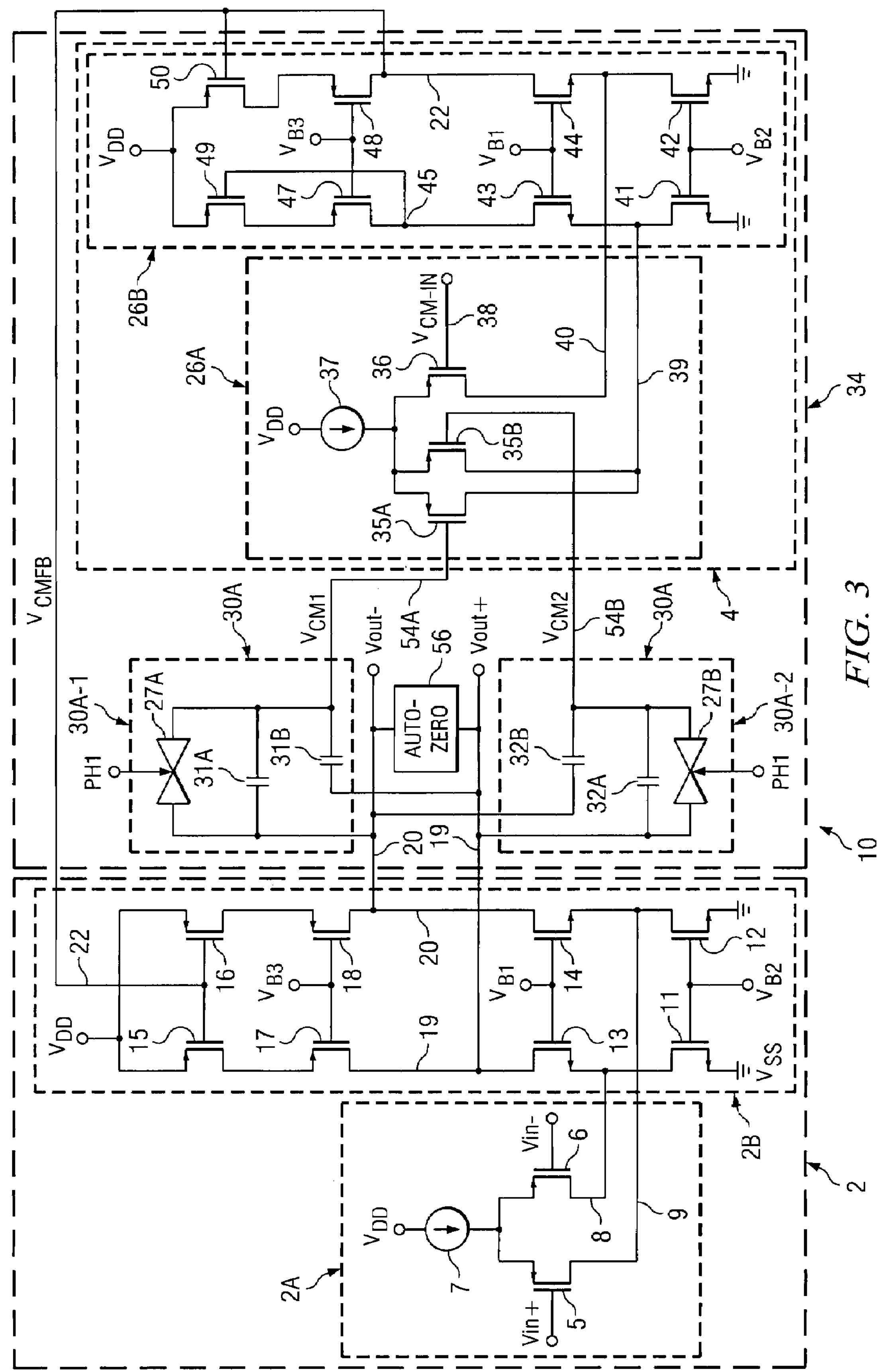
FIG. 3 is a schematic diagram of a differential amplifier having a common mode feedback circuit in accordance with the present invention.

Referring to FIG. 3, differential amplifier 10 includes an input stage 2 having a differential input transistor pair 2A and a folded cascode stage 2B. Differential input transistor pair 2A includes P-channel input transistors 5 and 6, the gates of which receive input signals $Vin^+$ and $Vin^-$, respectively. The sources of input transistors 5 and 6 are connected to a tail current source 7. The drains of input transistors 5 and 6 are connected to summing junctions 9 and 8, respectively, of folded cascode stage 2B. Summing junction 9 is connected to the drain of N-channel current source transistor 12 and the source of N-channel cascode transistor 14 of folded cascode stage 2B, and summing junction 8 is connected to the drain of N-channel current source transistor 11 and the source of N-channel cascode transistor 13. The sources of transistors 11 and 12 are connected to ground or $V_{SS}$. The gates of cascode transistors 13 and 14 are connected to a suitable bias voltage $V_{B1}$, and the gates of current source transistors 11 and 12 are connected to a suitable bias voltage $V_{B2}$. The collectors of cascode transistor 13 and P-channel cascode transistor 17 are connected to an output conductor 19 on which an output voltage $Vout^+$ is produced, and similarly, the collector of cascode transistor 14 is connected to the collector of a P-channel cascode transistor 18 by means of a conductor 20 on which the output voltage $Vout^-$ is produced. The gates of cascode transistors 17 and 18 are connected to a suitable bias voltage $V_{B3}$. The sources of cascode transistors 17 and 18 are connected to the drains of P-channel current source transistors 15 and 16, respectively, the sources of which are connected to $V_{DD}$. The gates of current source transistors 15 and 16 are connected by common mode feedback conductor 22 to the output of folded cascode stage 26B of common mode output circuit 34. A conventional auto-zero circuit 56 may be coupled to $Vout^+$ and $Vout^-$.

Common mode output circuit 34 includes a tracking circuit 30A and also an auxiliary amplifier 4 which includes a differential input stage 26A and folded cascode stage 26B. Tracking circuit 30A includes a first CMOS transmission gate switch 27A and a tracking capacitor 31A connected in parallel between conductors 20 and 54A, and also includes another tracking capacitor 31B connected between output conductor 19 and conductor 54A. Tracking capacitors 31A and 31B can be thought of as a "split" version of tracking capacitor 31 in Prior Art FIG. 2, and the circuitry including switch 27A and "split" tracking capacitors 31A and 31B can be thought of as a first section 30A-1 of tracking circuit 30A. Similarly, a second CMOS transmission gate switch 27B is coupled in parallel with a tracking capacitor 32A between conductor 19 and conductor 54B, and another tracking capacitor 32B is connected between conductor 20 and conductor 54B. Tracking capacitors 32A and 32B can be thought of as a "split" version of tracking capacitor 32 in Prior Art FIG. 2, and the circuitry including switch 27B and "split" tracking capacitors 32A and 32B can be thought of as a second section 30A-2 of tracking circuit 30A.

During the above-mentioned "phase one", the signal PH1 causes switches 27A and 27B to be turned on prior to the amplification phase of differential amplifier 10 in order to discharge tracking capacitors 31A and 32A and provide directly coupled DC paths from $Vout^+$ and $Vout^-$ to the gates of input transistors 35A and 35B, respectively, in order to provide DC bias points for the gates of transistors 35A and 35B. During the amplification phase when switches 27A and 27B are open, the actual common mode output voltages $V_{CM1}$ and $V_{CM2}$ are produced on conductors 54A and 55B.

Input stage 26A of common mode output circuit 34 includes P-channel input transistors 35A, 35B and 36, the sources of which are connected to tail current source 37. The gate of input transistor 35A receives $V_{CM1}$ on conductor 54A, and the gate of input transistor 35B receives $V_{CM2}$ on conductor 54B. The drains of input transistors 35A and 35B are connected to summing junction 39 of folded cascode stage 26B. The gate of input transistor 36 is connected to conductor 38, on which the desired common mode input voltage $V_{CM-IN}$ for differential amplifier 10 is produced. The drain of input transistor 36 is coupled to summing junction 40 of folded cascode stage 26B.

Folded cascode circuit 26B includes N-channel current source transistors 41 and 42 having their sources connected to ground (or $V_{SS}$) and their gates connected to bias voltage $V_{B2}$. The drain of transistor 41 is connected by summing junction 39 to the source of N-channel cascode transistor 43, and the drain of transistor 42 is connected by summing junction 40 to the source of N-channel cascode transistor 44. The gates of transistors 43 and 44 are coupled to bias voltage $V_{B1}$. The drains of cascode transistors 43 and 44 are connected to the drains of P-channel cascode transistors 47 and 48, respectively, the gates of which are coupled to bias voltage $V_{B3}$. The sources of cascode transistors 47 and 48 are connected to the drains of P-channel current source transistors 49 and 50, respectively, the sources of which are connected to $V_{DD}$. The gate of transistor 49 is connected by conductor 45 to the drains of cascode transistors 47 and 43, and the gate of transistor 50 is connected by common mode feedback conductor 22 to the drains of cascode transistors 44 and 48. It should be appreciated that if desired, cascode transistors 47 and 48 can be omitted and the drains of transistors 49 and 50 can be connected directly to the drains of transistors 43 and 44, respectively. Alternatively, transistors 49 and 50 can be connected in a conventional current mirror configuration, with their gates both connected to conductor 45. Also, cascode transistors 17 and 18 in folded cascode stage 2B also can be omitted in the same way if desired. It also should be appreciated that stage 26B of a auxiliary amplifier 4 can be implemented by almost any kind of secondary amplifying circuit to produce the common mode feedback control signal on conductor 22.

Figure 1:
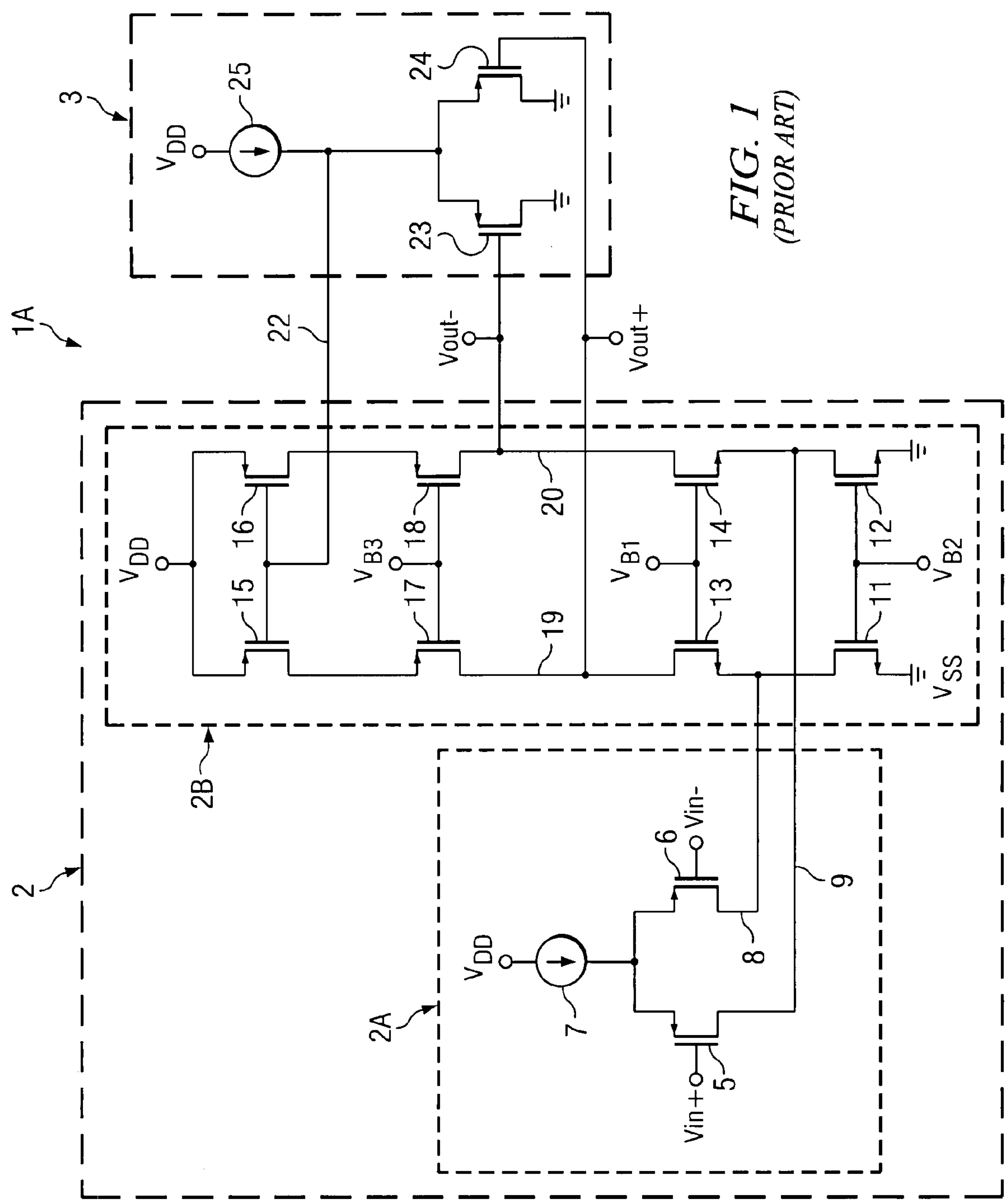
FIG. 1 is schematic diagram of a differential amplifier having a prior art common mode feedback circuit.
Figure 2:
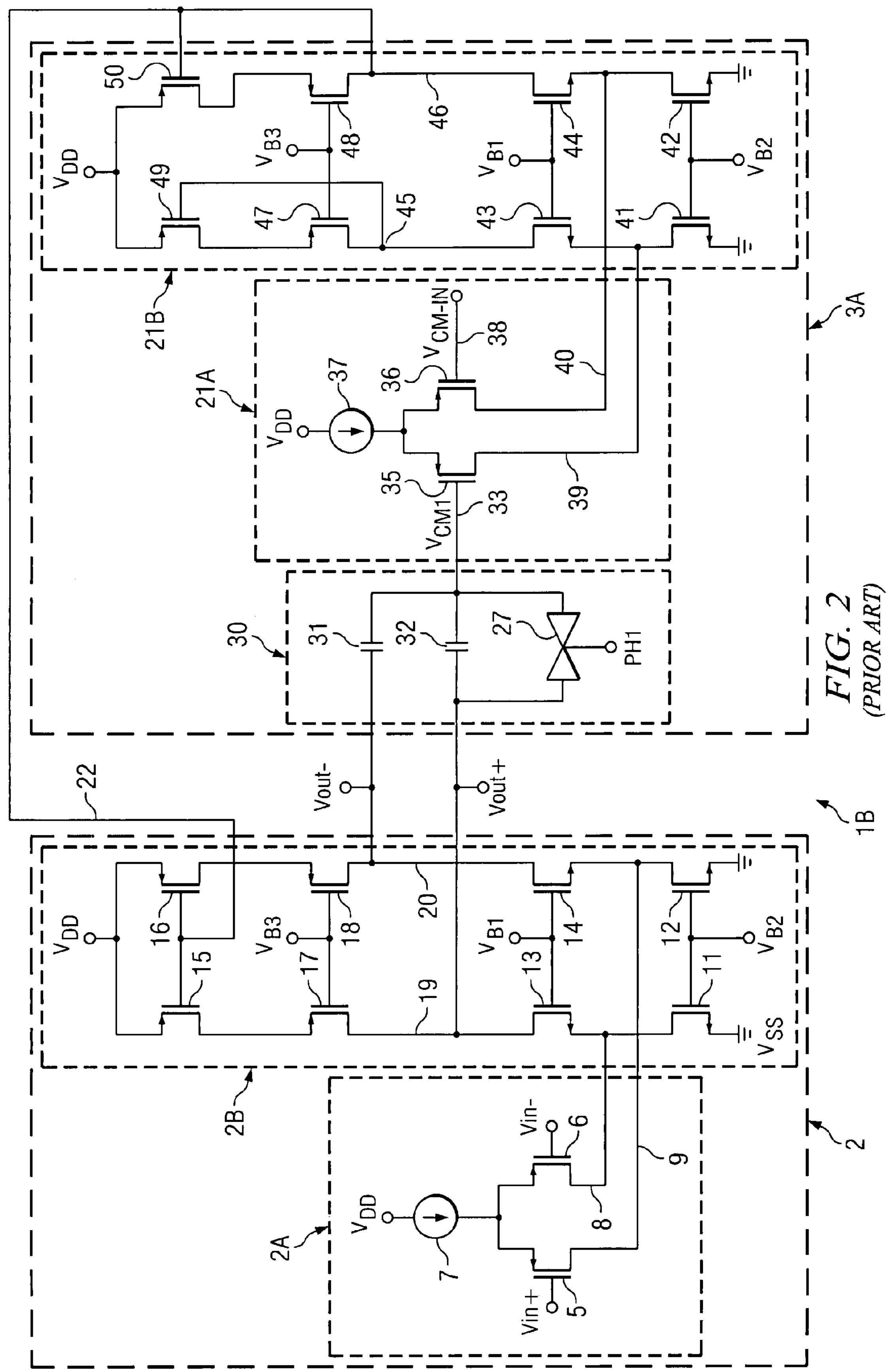
FIG. 2 is a schematic diagram of a differential amplifier having another prior art common mode feedback circuit.

Common mode feedback circuit 34 in FIG. 3 differs from other common mode feedback circuits, such as the one shown in Prior Art FIG. 2, by providing complete symmetry with respect to both outputs $Vout^+$ and $Vout^-$, and avoids the problem of short-circuiting $Vout^+$ to $Vout^-$ during the initial or auto-zeroing phase. This symmetry minimizes errors introduced into the differential output voltage $Vout^+ - Vout^-$ introduced by the above-mentioned asymmetrical charge injection into the conductors of output voltages $Vout^+$ and $Vout^-$. Furthermore, common mode feedback circuit 34 in FIG. 3 does not adversely affect the differential output voltage in any other ways, and precisely controls the output common mode voltage. Common mode feedback circuit 34 also allows large output voltage swings of the main amplifier input stage 2 without adversely affecting the output common mode voltage.

It should be appreciated that input transistor 35 in the differential input transistor pair 21A of Prior Art FIG. 2 can be thought of as being "split" in half to provide the two input transistors 35A and 35B in differential input stage 26A of FIG. 3. This is also necessary to prevent short-circuiting of $Vout^+$ to $Vout^-$ while switches 27A and 27B are closed. It should also be appreciated that since the sizes of "split" tracking capacitors 31A, 31B, 32A and 32B are only half the sizes of tracking capacitors 31 and 32 in Prior Art FIG. 2, and since input transistors 35A and 35B in FIG. 3 are half the size of input transistor 35 in Prior Art FIG. 2, the only additional integrated circuit chip area required for the present invention is the area required for the extra CMOS switch.

To understand the operation of capacitors 31B and 32B, which are cross-connected between conductors 54A and 54B and the "opposite" $Vout^+$ or $Vout^-$ conductors 19 and 20, it is helpful to note that if, in Prior Art FIG. 2, an additional switch identical to 27 is connected across tracking capacitor 31, it will short-circuit $Vout^+$ to $Vout^-$. What is needed is for the values of $Vout^+$ and $Vout^-$ to be separated by the amplifier input offset voltage during the zero-ing phase, i.e., during PH1. That is why in FIG. 3 each of the tracking capacitors of FIG. 2 has been split into a pair of tracking capacitors, and also is why input transistor 35 of FIG. 2 is split into a pair of input transistors. During PH1, $Vout^-$ is short-circuited by switch 27A to the gate of transistor 35A and $Vout^+$ is short-circuited by switch 27B to the gate of transistor 35B. The result is that at the end of PH1, the same amount of parasitic charge is injected into both conductors 54A and 54B when switches 27A and 27B are opened. Also, short-circuiting $Vout^+$ to $Vout^-$ is avoided, and the input offset voltage can be stored across capacitors 31A and 31B.

The basic structure shown in FIG. 3 is workable using either P-channel or N-channel transistors in the differential input pair 2A and using either P-channel or N-channel transistors in input stage 26A of auxiliary amplifier 4. Furthermore, control of the current through folded cascode stage 2B can be achieved by using a common mode feedback control signal coupled to the gates of either N-channel current source transistors 11 and 12 or P-channel current source transistors 15 and 16. Also, it would be practical in some cases to provide both P-channel and N-channel differential input transistor pairs so as to provide a rail-to-rail differential input stage.

It should be appreciated that common mode feedback circuit 34 is useful in a differential amplifier either with or without auto-zeroing, as long as there is a "phase" during which $Vout^+$ and $Vout^-$ are at nearly the same in mid-range voltage when switches 27A and 27B are closed to provide DC paths to the gates of transistors 35A and 35B.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the main amplifier 2 could be implemented using bipolar NPN and/or PNP transistors in place of any of the various N-channel and/or P-N-channel transistors. Also, bipolar transistors could be used to implement whatever kind of secondary amplifying circuitry is selected to perform the function of folded cascode stage 26B.

What is claimed is:

1. A differential amplifier comprising:

a differential input transistor pair including first and second input transistors each having a first electrode, a second electrode, and a control electrode;

a first folded cascode stage including first, second, third and fourth current source transistors and first and second cascode transistors each having a first electrode, a second electrode, and a control electrode, first and second summing junctions coupled to the second electrodes of the first and second input transistors, respectively, and first and second outputs conducting first and second output signals, respectively, the second electrodes of the first and second current source transistors being coupled by the first and second summing junctions, respectively, to the first electrodes of the first and second cascode transistors, the second electrodes of the first and second cascode transistors being coupled to the first and second outputs, respectively, and the second electrodes of the third and fourth current source transistors being coupled to the first and second outputs, respectively; and common mode feedback circuitry including:

a tracking circuit that includes a first section coupled to receive both the first and second output signals for producing the first common mode output signal and a second section coupled to receive both the first and second output signals for producing the second common mode output signal, wherein the first section includes first and second tracking capacitors having first terminals connected to produce the first common mode output signal and a first switch coupled across the first tracking capacitor, a second terminal of the first tracking capacitor being coupled to receive the first output signal, a second terminal of the second tracking capacitor being coupled to receive the second output signal, and wherein the second section includes third and fourth tracking capacitors having first terminals connected to produce the second common mode output signal and a second switch coupled across the third tracking capacitor, a second terminal of the third tracking capacitor being coupled to receive the second output signal, a second terminal of the fourth tracking capacitor being coupled to receive the first output signal; and an auxiliary amplifier stage including a differential input stage including third, fourth and fifth input transistors, gates of the third and fourth input transistors being coupled to receive the first and second common mode output signals, respectively, a gate of the fifth input transistor being coupled to receive a desired common mode voltage, drains of the third and fourth input transistors being coupled to a first input of a secondary amplifying stage having an output, a drain of the fifth input transistor being coupled to a second input of the secondary amplifying stage, the output of the secondary amplifying stage coupling a common mode feedback control signal to bias the control electrodes of the third and fourth current source transistors.

2. The differential amplifier of claim 1 wherein capacitances of the first, second, third and fourth tracking capacitors are equal and the first and second switches are of equal size.

3. The differential amplifier of claim 1 wherein the first and second switches are of equal size and capacitances of the first, second, third and fourth tracking capacitors have values which result in symmetric charge injection into the first and second outputs of the first folded-cascode stage.

4. The differential amplifier of claim 1 wherein the first and second input transistors are P-channel transistors the first electrodes of which are sources, the second electrodes of which are drains, and the control electrodes of which are gates, and the first and second current source transistors and the first and second cascode transistors are N-channel transistors the first electrodes of which are sources, the second electrodes of which are drains, and the control electrodes of which are gates.

5. The differential amplifier of claim 4 wherein the third and fourth current source transistors are P-channel transistors the first electrodes of which are sources, the second electrodes of which are drains, and the control electrodes of which are gates, the first folded-cascode stage including a P-channel third cascode transistor coupled between the drain of the third current source transistor and the first output and a P-channel fourth cascode transistor coupled between the drain of the fourth current source transistor and the second output.

6. The differential amplifier of claim 1 wherein the third, fourth and fifth input transistors are P-channel transistors.

7. The differential amplifier of claim 6 wherein the secondary amplifying stage includes a second folded cascode circuit which includes a N-channel fifth cascode transistor having a source coupled to a third summing junction in the second folded cascode circuit and a drain coupled to a drain and gate of a P-channel seventh current source transistor and a N-channel sixth cascode transistor having a source coupled to a fourth summing junction in the second folded cascode circuit and a drain coupled to a drain and gate of a P-channel eighth current source transistor and to the output conducting the common mode feedback control signal.

8. The differential amplifier of claim 1 wherein the first and second switches are closed in response a phase signal during an initial phase and then are opened during an amplifying phase of the differential amplifier.

9. The differential amplifier of claim 8 wherein the first and second switches are CMOS switches.

10. The differential amplifier of claim 8 including an auto-zeroing circuit coupled between the first and second outputs of the first folded cascode stage.

11. A differential amplifier comprising:

a first differential input stage that is adapted to receive an input signal;

a first folded-cascode stage that is coupled to the first differential input stage, wherein the first folded cascode stage includes a first output terminal and a second output terminal;

a first tracking capacitor that coupled between a first common mode terminal and the first output terminal;

a second tracking capacitor that is coupled between the first common mode terminal and the second output terminal;

a third tracking capacitor that is coupled between a second common mode terminal and the first output terminal;

a fourth tracking capacitor that is coupled between the second common mode terminal and the second output terminal;

a first switch that is coupled between the first common mode terminal and the first output terminal;

a second switch that is coupled between the second common mode terminal and the second output terminal;

a second differential input stage that is coupled is coupled to the first and second common mode terminals; and a second folded-cascode stage that is coupled to the second differential input stage, wherein the second folded cascode stage includes a common mode output terminal that is coupled to the first folded cascode stage.

12. The differential amplifier of claim 11 wherein the differential amplifier further comprises an auto-zeroing circuit that is coupled between the first and second output terminals.

13. The differential amplifier of claim 11 wherein the first, second, third, and fourth capacitors have the capacitances.

14. The differential amplifier of claim 11 wherein the first and second switches are of equal size and capacitances of the first, second, third and fourth tracking capacitors have values which result in symmetric charge injection into the first and second outputs terminals.

15. The differential amplifier of claim 11 wherein the differential input stage further comprises:

a current source;

a differential input transistor pair, wherein each transistor of the pair is coupled to the current source and to one of the first and second common mode terminals; and an input transistor that is coupled to the current source and that is adapted to receive a predetermined common mode voltage.

16. A common mode output circuit for an input stage having a first output terminal and a second output terminal, the common mode output circuit comprising:

a tracking stage having:

a first tracking capacitor that coupled between a first common mode terminal and the first output terminal;

a second tracking capacitor that is coupled between the first common mode terminal and the second output terminal;

a third tracking capacitor that is coupled between a second common mode terminal and the first output terminal;

a fourth tracking capacitor that is coupled between the second common mode terminal and the second output terminal;

a first switch that is coupled between the first common mode terminal and the first output terminal;

a second switch that is coupled between the second common mode terminal and the second output terminal; and an amplifier having:

a differential input stage that is coupled is coupled to the first and second common mode terminals; and a folded-cascode stage that is coupled to the differential input stage, wherein the second folded cascode stage includes a common mode output terminal that is adapted to be coupled to the input stage.

17. The common mode output circuit of claim 16 wherein the differential input stage further comprises:

a current source;

a differential input transistor pair, wherein each transistor of the pair is coupled to the current source and to one of the first and second common mode terminals; and an input transistor that is coupled to the current source and that is adapted to receive a predetermined common mode voltage.

18. The differential amplifier of claim 16 wherein the common mode output circuit further comprises an auto-zeroing circuit that is coupled between the first and second output terminals.

19. The differential amplifier of claim 16 wherein the first, second, third, and fourth capacitors have the capacitances.

20. The differential amplifier of claim 16 wherein the first and second switches are of equal size and capacitances of the first, second, third and fourth tracking capacitors have values which result in symmetric charge injection into the first and second outputs terminals.

* * * * *